United States Patent
Ngo et al.

(10) Patent No.: US 7,975,718 B2
(45) Date of Patent: Jul. 12, 2011

(54) IN-SITU MONITOR OF INJECTION VALVE

(75) Inventors: Khai Ngo, Austin, TX (US); Son Nguyen, San Jose, CA (US); Ernesto Ulloa, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 994 days.

(21) Appl. No.: 11/735,941

(22) Filed: Apr. 16, 2007

(65) Prior Publication Data

US 2008/0251137 A1    Oct. 16, 2008

(51) Int. Cl.
*F16K 37/00*    (2006.01)

(52) U.S. Cl. .............. 137/551; 137/486; 137/487.5

(58) Field of Classification Search ............ 137/551, 137/486, 487.5
See application file for complete search history.

(56) References Cited

U.S. PATENT DOCUMENTS

| | | | |
|---|---|---|---|
| 5,251,872 A * | 10/1993 | Kodaira | 251/129.04 |
| 6,131,609 A * | 10/2000 | Metso et al. | 137/552 |
| 6,224,681 B1 | 5/2001 | Sivaramakrishnan et al. | |
| 6,267,820 B1 | 7/2001 | Chen et al. | |
| 6,752,387 B1 | 6/2004 | Nishizato et al. | |
| 6,783,118 B2 | 8/2004 | Sivaramakrishnan et al. | |
| 6,793,965 B2 | 9/2004 | Chen et al. | |
| 6,818,094 B2 | 11/2004 | Yudovsky | |
| 6,868,859 B2 | 3/2005 | Yudovsky | |
| 6,955,211 B2 | 10/2005 | Ku et al. | |
| 6,994,319 B2 | 2/2006 | Yudovsky | |
| 7,055,809 B2 | 6/2006 | Sivaramakrishnan et al. | |
| 7,066,194 B2 | 6/2006 | Ku et al. | |
| 7,115,186 B2 | 10/2006 | Miyamoto et al. | |
| 7,166,016 B1 | 1/2007 | Chen | |
| 2006/0270221 A1 | 11/2006 | M'Saad et al. | |

* cited by examiner

*Primary Examiner* — Stephen M Hepperle
*Assistant Examiner* — William McCalister
(74) *Attorney, Agent, or Firm* — Patterson & Sheridan, L.L.P.

(57) ABSTRACT

The present invention generally provides methods and apparatus for monitoring performance of an injection valve. In one embodiment, a control signal relates to an actuator movement is monitored and correlated to performance of the injection valve.

4 Claims, 3 Drawing Sheets

IN-SITU MONITOR OF INJECTION VALVE

BACKGROUND OF THE INVENTION

1. Field of the Invention

Embodiments of the present invention generally relate to an apparatus and method for processing semiconductor substrates. More particularly, embodiments of the present invention relate to monitoring performance of an injection valve configured to vaporize liquid reactant and to provide vaporized reactant to a process chamber.

2. Description of the Related Art

Semiconductor processes, for example chemical vapor deposition (CVD) and atomic layer deposition (ALD), sometimes require one or more vaporized processing liquids. These vaporized liquids are generally generated and supplied to a process chamber via a system of pipes (or "lines") and vaporizing mechanisms known as a gas delivery system. Typically a separate vaporizing mechanism is provided for vaporizing each processing liquid, and is coupled to a source of processing liquid and a source of carrier gas. Each vaporizing mechanism and processing liquid source combination within a gas delivery system is referred to as a vaporization stage. Although a number of vaporizing mechanisms exist (e.g., bubblers, injection valves, etc.), most conventional gas delivery systems employ a plurality of injection valves for vaporizing processing liquids to be delivered to a process chamber, for example a CVD chamber or an ALD chamber.

A typical injection valve comprises a vaporization region. The vaporization region is coupled to a processing liquid inlet for receiving a pressurized processing liquid, a carrier gas inlet for receiving a pressurized inert carrier gas, and an outlet for delivering a vaporized processing liquid/carrier gas mixture. The processing liquid inlet, by necessity, is small in size so as to maintain a low partial vapor pressure of the processing liquid in the carrier gas.

The processing liquid inlet's small size renders the processing liquid inlet susceptible to clogs which result from residue produced when processing liquid reacts with moisture or other contaminants in the gas delivery system. A clogged injection valve can cause downtime not only of the chamber to which the clogged injection valve is coupled, but also of upstream and/or downstream chambers.

To prevent clogging and system downtime caused by clogging, injection valves may be cleaned after in use for a period of time. However, clogging may still happen when cleaning is not performed soon enough while too frequent cleaning increases cost of ownership.

Therefore, there exists a need for apparatus and methods for detecting injection valve clogging and corresponding injection valve cleaning.

SUMMARY OF THE INVENTION

The present invention generally provides methods and apparatus for monitoring performance of an injection valve.

Certain embodiments of the present invention provide a method for monitoring performance of an injection valve, comprising providing a control signal to the injection valve to allow a liquid reactant to flow through the injection valve, measuring a flow rate of the liquid reactant flown to the injection valve, and monitoring the control signal to the injection valve.

Certain embodiments of the present invention provide a method for delivering a liquid reactant to a processing chamber comprising providing a control signal to an injection valve to allow the liquid reactant to flow through the injection valve at a target flow rate, measuring a flow rate of the liquid reactant through the injection valve, and monitoring one or more properties of the control signal to determine performance of the injection valve.

Certain embodiments of the present invention provide an apparatus for delivering a liquid reactant to a processing chamber comprising an injection valve configured to receive the liquid reactant from a liquid inlet, to vaporize the liquid reactant and to output vaporized the liquid reactant, wherein the injection valve comprises an actuation member configured to adjust the flow rate of the liquid reactant through the injection valve, a liquid flow meter configured to measure a flow rate of the liquid reactant through the injection valve, and a performance monitor configured to monitor a control signal that controls a movement of the actuation member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides methods and apparatus for monitoring performance of an injection valve. In one embodiment, a control signal relates to an actuator movement is monitored and correlated to performance of the injection valve.

Figure 1:
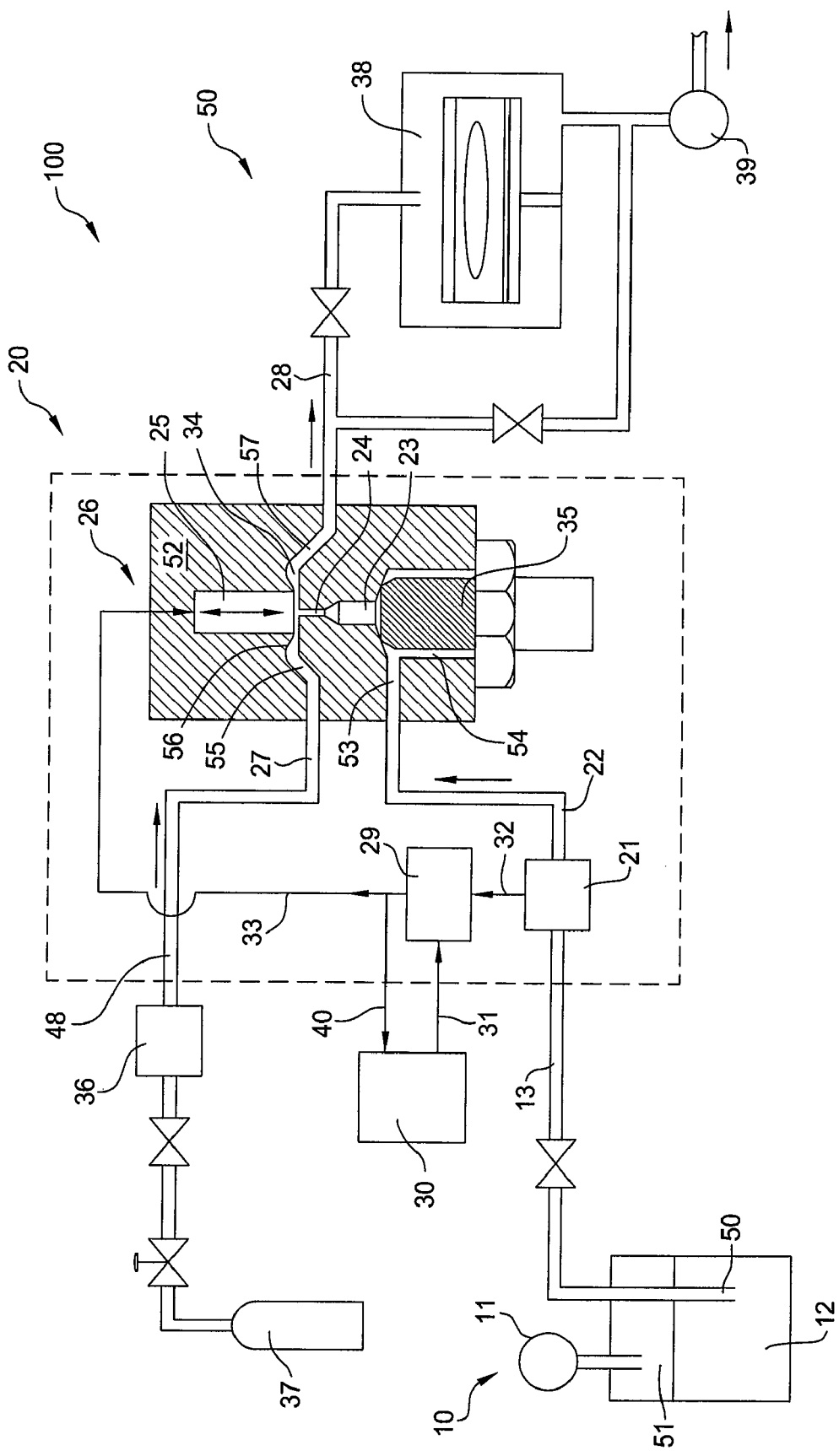
FIG. 1 schematically illustrates a liquid delivery system in accordance with one embodiment of the present invention.

FIG. 1 schematically illustrates a liquid delivery system 100 in accordance with one embodiment of the present invention.

The liquid delivery system 100 comprises a vaporizer assembly 20. The vaporizer assembly 20 is configured to vaporize a liquid reactant and flow the vaporized reactant, usually along with a carrier gas, to a processing chamber. The vaporizer assembly 20 is connected with two inputs: a liquid source 10 via an input line 13, and a carrier gas tank 37 via an input line 48. The vaporizer assembly 20 has an output line 28 which may be connected to a processing chamber 38. The vaporizer assembly 20 is further connected to a control unit 30 through an input signal line 31 and a monitoring line 40. The control unit 30 is configured to control the flow rate of the vaporizer assembly 20 and to monitor the performance of the vaporizer assembly 20.

The liquid source 10 comprises a tank 12 configured to retain a liquid reactant. A dip tube 50 extends under a liquid surface in the tank 12. A gas source 11 is connected to the tank 12 providing a pressurized gas, such as helium, to head space 51 at the top of the tank 12, above the liquid surface, for driving the liquid reactant into the dip tube 50 which may be connected to the input line 13.

The vaporizer assembly 20 may be used to vaporize suitable liquid reactants, for example tetraethyl orthosilicate (TEOS), trimethyl borate, tetraethyl borate, tetraethyl phosphate, tetraethyl phosphite, tetrakis (dimethylamino) titanium, water or the like. The liquid converts to vapor by expansion and the vapor flows to the processing chamber 38 by means of a carrier gas, such as helium, nitrogen or argon.

The vaporizer assembly 20 comprises an injection valve 26 configured to vaporize a liquid reactant, a liquid flow meter 21 configured to measure a flow rate of the liquid reactant flown to the injection valve 26, and a controller 29 configured to control the flow rate of the liquid reactant to the injection valve 26.

In one embodiment, an inlet of the liquid flow meter 21 is connected to the input line 13 and an outlet of the liquid flow meter 21 is connected to a liquid inlet 22 of the injection valve 26. The carrier gas tank 37 containing a carrier gas is connected to a gas inlet 27 of the injection valve 26 through a mass flow controller 36 which regulates flow rate of the carrier gas.

The injection valve 26 is configured to vaporize a liquid reactant flown in through a liquid inlet 22. The liquid let 22 is connected by a passage 53 formed in a valve body 52 to a shut off valve bore 54. A piston 35 is movably disposed in the shut off valve bore 54. The piston 35 may seat against an inner surface of the shut off valve bore 54 preventing the liquid from flowing. When the piston 35 moves away from the inner surface of the shut off valve bore 54, the liquid may flow from the passage 53 to a passage way 23 connected to an injection valve opening 24. Any suitable actuation means may be used to move the piston 35.

When the piston 35 opens the shut off valve bore 54, the passage 53 is in variable fluid communication with an injection valve cavity 34 through a diaphragm 56 controlled by an actuation member 25. The injection valve opening 24 is relatively small compared to the injection valve cavity 34. A pressure gradient forms between the injection valve opening 24 and the injection valve cavity 34 causing the liquid reactant in the injection valve opening 24 to vaporize due to expansion. The vaporized liquid reactant flows out of the injection valve 26 with the carrier gas through a passage 57 to the output line 28. The carrier gas flows in from the gas inlet 27 through a passage 55 to the valve cavity 34. A controlled amount of liquid is injected from the injection valve opening 24.

The diaphragm 56 moves relatively to the injection valve opening 24 controlling the flow rate of the liquid being vaporized. The liquid flow from the injection valve opening 24 may be shut off when the diaphragm 56 contacts the injection valve opening 24. While the liquid flow from the injection valve opening 24 increases as the diaphragm 56 moves away from the injection valve opening 24.

The actuation member 25 is configured to move the diaphragm 56 relative to the injection valve opening 24. The actuation member 25 may be an electrically controlled actuator. In one embodiment, the liquid flow rate may be controlled by the controller 29 using a closed loop control configuration. Upon receiving a target flow rate, for example from the control unit 30, the controller 29 sends an electrical control signal to the actuation member 25 via a control line 33. The actuation member 25 moves the diaphragm 56 according to the electrical control signal. The liquid flow meter 21 measures the actual liquid flow let through by the actuation member 25. The liquid flow meter 21 provides a measured flow rate to the controller 29 via a monitoring line 32. The controller 29 compares the measured flow rate from the liquid flow meter 21 with the target flow rate and adjusts the electrical control signal so that the measured flow rate approximates the target flow rate.

In one embodiment, the actuation member 25 is a piezoelectric member. Electrical excitation of the piezoelectric member expands and compresses causing the diaphragm 56 to move closer to or further from the injection valve opening 24, thereby controlling liquid flow. In one embodiment, the piezoelectric member can be selected to provide a 0-30 μm gap adjustment range, e.g., at an input voltage of 0 Volts, the gap is 0 μm, at an input voltage of 5 Volts, the gap is 10-15 μm, and at an input voltage of 15 Volts, the gap is 30 μm. Thus, the piezoelectric member not only provides liquid flow control, but can also operate to fully shut off liquid flow temporarily.

Detailed description of an injection valve may be found in the U.S. Pat. No. 6,224,681, No. 6,783,118, and No. 7,055,809 to Sivaramakrishnan et. al, which are incorporated herein by reference.

In one embodiment of the present invention, the electrical control signal from the controller 29 to the actuation member 25 is monitored to determine the performance of the injection valve 26. The electrical control signal to achieve the same liquid flow rate may vary due to the performance of the injection valve 26. For example, when the injection valve 26 is clogged, particularly when the injection valve opening 24 is clogged, the flow rate decreases if the diaphragm 56 remains in the same position relative to the injection valve opening 24. The actuation member 25 may need to move the diaphragm farther away from the injection valve opening 24 to achieve the same flow rate when the injection valve opening 24 is clogged. Therefore, when performance of the injection valve 26 decreases, for example due to clogging, a control signal correlating to an increased gap between the diaphragm 56 and the injection valve opening 24 is sent to the actuation member 25 to achieve the same flow rate.

As shown in FIG. 1, a monitoring line 40 may be tapped to the control line 33 to get the electrical control signal to monitor the performance of the injection valve 26. In one embodiment, a monitoring software may be used in the control unit 30 to monitor the electrical control signal from the monitoring line 33 and the target flow rate sent to the controller 29 through the signal line 31. In one embodiment, a correlation between target flow rates and normal strength (such as voltage or current) of the electrical control signal may be established. The feed back signal from the monitoring line 40 drifting outside a normal range according to the established correlation usually indicates the performance of the injection valve 26 is decreasing, or at least not at an optimal level.

The control unit 30 may further control one or more adjustment units to adjust the vaporizer assembly 20 to improve its performance when a performance decrease is observed.

Figure 2:
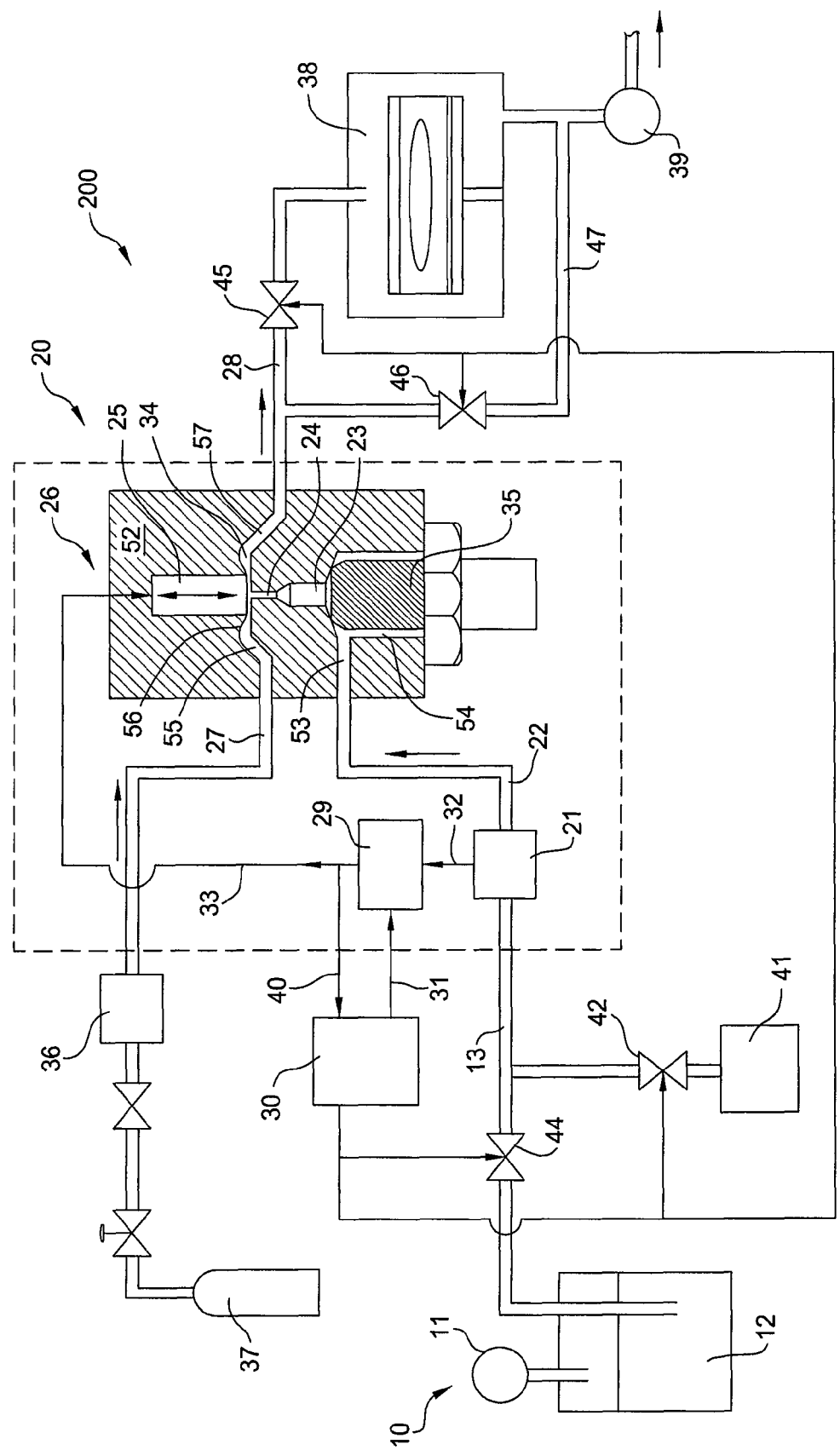
FIG. 2 schematically illustrates a liquid delivery system having a cleaning circuit in accordance with one embodiment of the present invention.

FIG. 2 schematically illustrates a liquid delivery system 200 having an injection valve with monitoring and cleaning system in accordance with one embodiment of the present invention. Identical reference numerals have been used to designate common elements to FIGS. 1 and 2 for simplicity.

The liquid delivery system 200 comprises a control unit 30 configured to monitor performance of the injection valve 26 in the vaporizer assembly 20 and to clean the injection valve 26 when decreased performance is detected.

In one embodiment, a cleaning source 41 is connected to the liquid flow meter 21 and is configured to provide a cleaning solution to the injection valve 26 to remove clogs in the injection valve 26. Output lines from the liquid source 10 and the cleaning source 41 may be Teed together through shut off valves 44, 42 to join the input line 13 of the vaporizer assembly 20. The control unit 30 may control the shut off valves 42, 44 to provide the vaporizer assembly 20 with liquid from the liquid source 10 for processing or with cleaning solution from the cleaning source 41 for cleaning. In one embodiment, the shut off valves 42, 44 may be pneumatic and manual for both automatic control and manual control.

In one embodiment, a shut off valve 45 may be positioned between the output line 28 of the injection valve 26 and the processing chamber 38, and a shut off valve 46 may be positioned in a bypass line 47 between the output line 28 of the injection valve 26 and the vacuum pump 39. The control unit 30 may be configured to control the shut off valves 45, 46. In one embodiment, the control unit 30 may control a cleaning process by closing the shut off valve 44 to stop the liquid reactant, opening the shut off valve 42 to flow a cleaning solution to the injection valve 26, and/or any flow passages that might be clogged. In one embodiment, the control unit 30 may close the shut off valve 45 to prevent cleaning solution from entering the processing chamber 38, and open the shut off valves 46 to direct the cleaning solution from the injection valve 26 directly to an exhaust.

Figure 3:
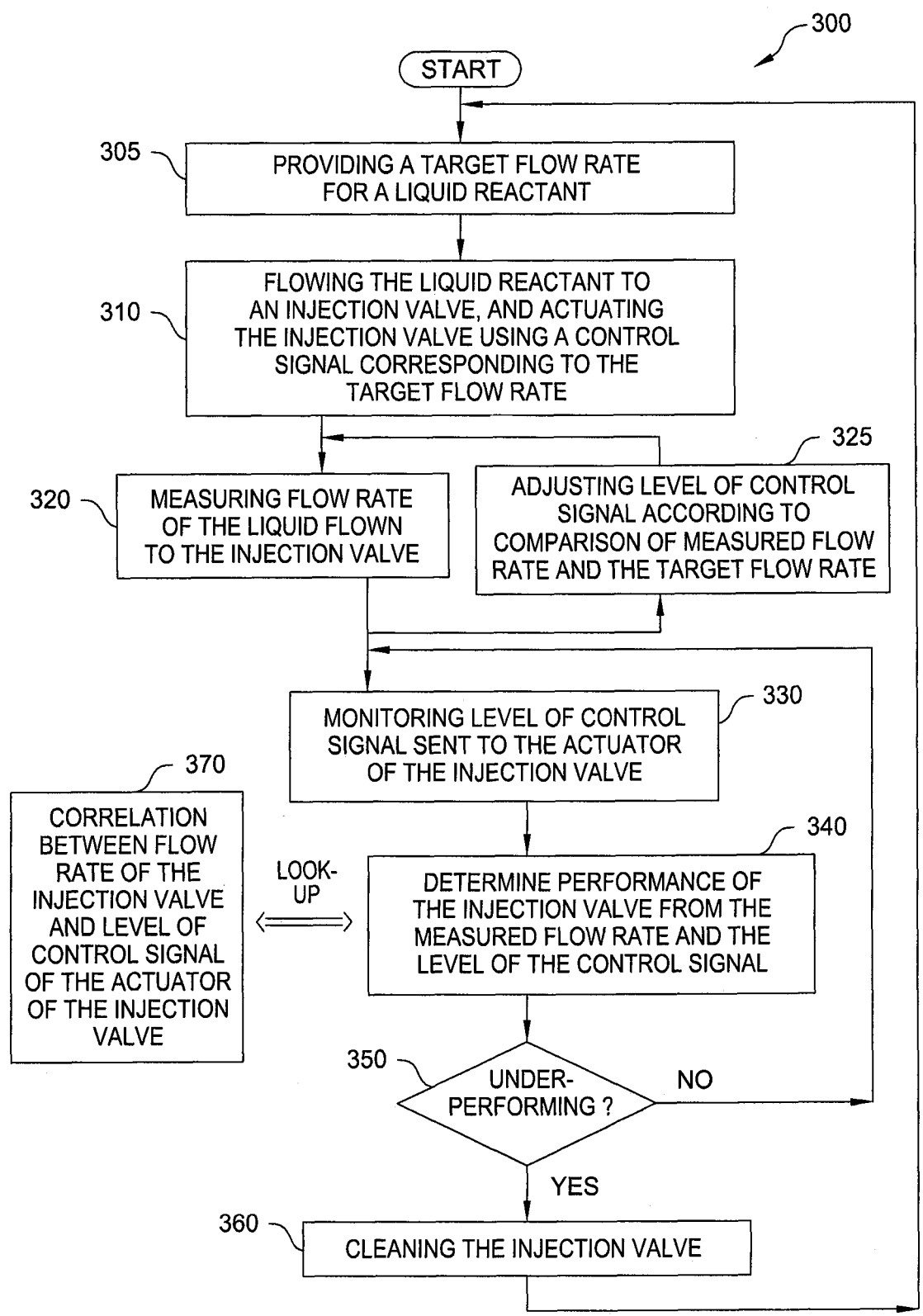
FIG. 3 schematically illustrates a method for monitoring an injection valve in accordance with one embodiment of the present invention.

FIG. 3 schematically illustrates a method 300 for vaporizing and delivering a liquid reactant through an injection valve in accordance with one embodiment of the present invention.

In step 305, a target flow rate for a liquid reactant may be provided, for example according to requirement of a process to be performed in a processing chamber where vaporized liquid reactant is needed.

Step 310 includes flowing the liquid reactant to an injection valve configured to vaporize the liquid reactant, such as the injection valve 26 of FIGS. 1 and 2, and actuating the injection valve using a control signal. The control signal is used to actuate the injection valve to let a controlled flow rate of the liquid reactant through. In one embodiment, the injection valve may comprise a piezoelectric valve which is controllable by a DC voltage and the voltage of the control signal corresponds to a flow rate.

Step 320 includes measuring the flow rate of the liquid reactant to the injection valve. In one embodiment, the measurement may be performed by a liquid flow meter disposed in an inlet of the injection valve.

Step 325 includes comparing measured flow rate and the target flow rate provided in step 305, and adjusting level of the control signal so that the measured flow rate approximates the target flow rate of the liquid reactant. Steps 320 and 325 may be performed reiteratively to obtain a closed loop control of the flow rate. Step 325 is generally necessary to obtain a desired flow rate in delivery. However, it may be optional for monitoring performance of the injection valve.

Step 330 includes monitoring level of the control signal sent to the injection valve. In one embodiment, monitoring the level of the control signal may be achieved by measuring a voltage level of the control signal.

Step 340 includes determining performance of the injection valve using measured level of the control signal.

In one embodiment, the control signal may be monitored during a time period, a decrease of performance, for example due to clogging, may be determined when the level of the control signal changes while the target flow rate remains the same. For example, when the target flow rate is unchanged, an increased level of control signal suggests that the injection valve needs to open wider to let the same amount of liquid reactant through indicating clogging in passages in the injection valve.

In another embodiment, decreases in performance may be indicated by a reduced flow rate when the control signal substantially remains the same.

In another embodiment, changes in performance may be detected by comparing the monitored control signal with a correlation 370 between the flow rate and the level of the control signal for the injection valve. The correlation 370 may be a table of series of flow rates and ranges of acceptable levels of control signal associated with the series of flow rates. The correlation 370 may be predetermined using experimental methods. The correlation 370 may be affected by a plurality of factors, for example parameters of a specific injection valves, operation conditions, and properties of liquid reactant being vaporized.

In step 350, an underperformance may be determined. In one embodiment, an underperformance may be determined when the level of control signal drifts out of a tolerable range. In another embodiment, an underperformance may be determined when correlation of the monitored control signal and the measured flow rate drifts away from the correlation 370.

If the injection valve is under performance, a cleaning process may be performed in step 360 to keep the injection valve in an optimal performance. If the injection valve is not under performance, continuous monitoring may be performed.

While the foregoing is directed to embodiments of the present invention, other and further embodiments of the invention may be devised without departing from the basic scope thereof, and the scope thereof is determined by the claims that follow.

The invention claimed is:

1. An apparatus for delivering a liquid reactant to a processing chamber, comprising:
    an injection valve configured to receive the liquid reactant from a liquid inlet, to vaporize the liquid reactant and to output the vaporized liquid reactant, wherein the injection valve comprises an actuation member configured to adjust the flow rate of the liquid reactant through the injection valve;
    a liquid flow meter configured to measure a flow rate of the liquid reactant through the injection valve; and
    a performance monitor configured to monitor a control signal that controls a movement of the actuation member and to detect a clog in the injection valve according to a correlation between the control signal and the measured flow rate of the liquid reactant through the injection valve.

2. The apparatus of claim 1, wherein the actuation member comprises a piezoelectric actuator and the control signal is configured to control expansion of the piezoelectric actuator.

3. The apparatus of claim 1, further comprising a controller configured to adjust the control signal according to the measured flow rate from the liquid flow meter.

4. The apparatus of claim 1, further comprising a cleaning circuit selectively connected to the liquid inlet of the injection valve, wherein the cleaning circuit is controlled by the performance monitor.

* * * * *

UNITED STATES PATENT AND TRADEMARK OFFICE
CERTIFICATE OF CORRECTION

| | | |
|---|---|---|
| PATENT NO. | : 7,975,718 B2 | Page 1 of 1 |
| APPLICATION NO. | : 11/735941 | |
| DATED | : July 12, 2011 | |
| INVENTOR(S) | : Ngo et al. | |

It is certified that error appears in the above-identified patent and that said Letters Patent is hereby corrected as shown below:

Title Page, Item (75)
In the Inventors:

Please delete "Austin, TX" and insert --Cedar Park, TX-- therefor.

Signed and Sealed this
Twenty-seventh Day of September, 2011

David J. Kappos
*Director of the United States Patent and Trademark Office*